(12) United States Patent
Gao et al.

(10) Patent No.: US 8,179,018 B2
(45) Date of Patent: May 15, 2012

(54) ACTIVE MATERIAL ACTUATOR REGULATION UTILIZING PIEZOELECTRIC AND PIEZORESISTIVE EFFECT

(75) Inventors: Xiujie Gao, Troy, MI (US); Alan L. Browne, Grosse Pointe, MI (US); Nancy L. Johnson, Northville, MI (US); Paul W. Alexander, Ypsilanti, MI (US); Lei Hao, Troy, MI (US); Ke Dong, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 445 days.

(21) Appl. No.: 12/546,857

(22) Filed: Aug. 25, 2009

(65) Prior Publication Data

US 2011/0050148 A1 Mar. 3, 2011

(51) Int. Cl.
*H02N 10/00* (2006.01)

(52) U.S. Cl. ......... 310/314; 310/307; 310/317; 310/319
(58) Field of Classification Search .......... 310/307, 310/314, 319, 328; 318/646, 117
See application file for complete search history.

(56) References Cited

U.S. PATENT DOCUMENTS

| 2008/0034750 A1* | 2/2008 | Gao et al. ................ 60/527 |
| 2008/0133090 A1* | 6/2008 | Browne et al. ............ 701/49 |
| 2008/0179170 A1* | 7/2008 | Beyrard et al. ........... 200/181 |

* cited by examiner

*Primary Examiner* — Thomas Dougherty
*Assistant Examiner* — Bryan Gordon

(57) ABSTRACT

An active material actuator adapted for use in a circuit includes an active material member, and a piezoelectric or piezoresistive element or otherwise force sensing device, wherein the element or device is communicatively coupled to the member and operable to vary the current within the circuit when the member is caused to achieve a predetermined stress, such that, in one aspect, the element presents an overload protection mechanism.

19 Claims, 3 Drawing Sheets

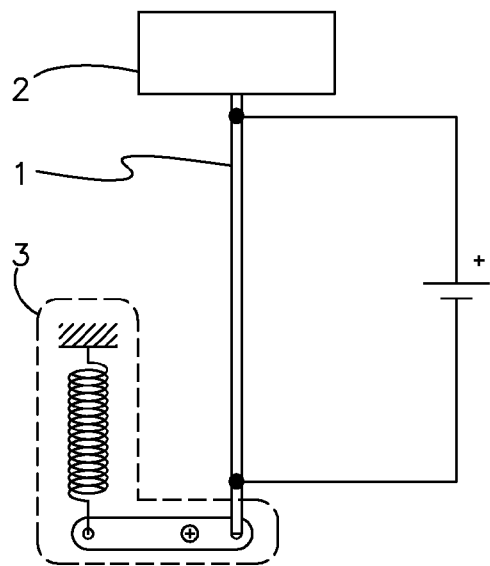
FIG. 1
(Prior Art)
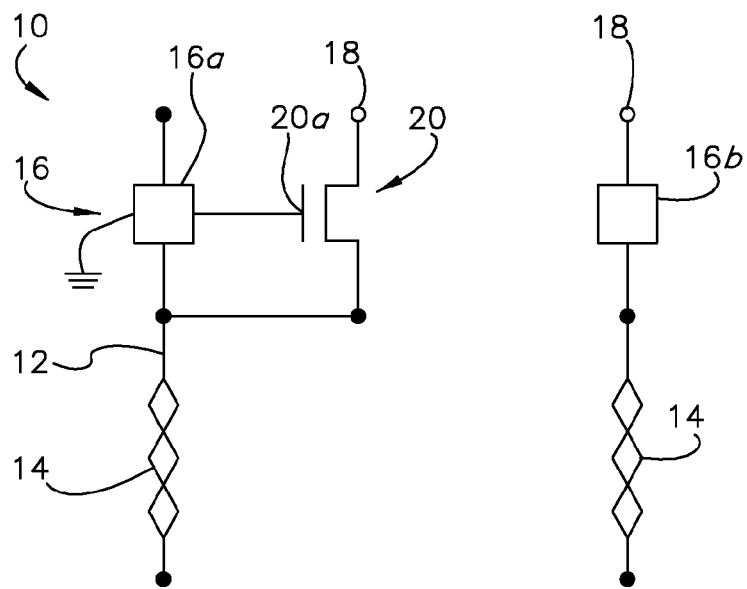
FIG. 2  FIG. 3  FIG. 4

ACTIVE MATERIAL ACTUATOR REGULATION UTILIZING PIEZOELECTRIC AND PIEZORESISTIVE EFFECT

BACKGROUND OF THE INVENTION

1. Field of the Invention

The present disclosure generally relates to overload protection mechanisms adapted for use with an active material actuator, and in particular, to a regulation/overload protection mechanism that utilizes piezoelectric or piezoresistive effect to autonomously regulate and/or interrupt an activation signal.

2. Discussion of Prior Art

In the Martensitic phase, shape memory alloy (SMA) actuators are activated by exposing the SMA component to a thermal activation signal. The signal causes the component to transform to the Austenitic phase, which presents a higher modulus and contracted length. As shown in prior art FIG. 1, transformation is typically used to do work, where the component 1 is coupled to and the change in length maneuvers a load 2. When the component 1 is activated, but the load 2 is unable to be maneuvered (e.g., due to external conditions, damaged parts, etc.), an overloading event that may overheat or otherwise damage the component 1 may occur.

To protect against overloading, conventional SMA actuators typically use mechanical spring mechanisms 3 (FIG. 1), sometimes in combination with a micro-switch or photointerruptor, to alleviate excess strain in the SMA component 1 during such an event. These mechanisms 3, however, present various concerns in the art, including, for example, increased overall actuator size, reduced packaging within the actuator, and increased weight. Accordingly, there is a need in the art for a more compact mechanism and/or method of providing overload protection to SMA actuators.

BRIEF SUMMARY OF THE INVENTION

Responsive to these concerns, the present invention recites an active material actuator circuit that utilizes a piezoelectric, piezoresistive or an otherwise force/pressure sensing element to regulate the activation signal. The invention is useful, among other things, for alleviating excessive load build-up in the actuator during overloading events; and as such, for preventing damage to and/or the overheating of the actuator. The inventive actuator presents a compact configuration that reduces the overall size of the actuator, increases internal package space, and reduces actuator weight, in comparison to prior art overload protection mechanisms.

In a first aspect of the invention, the actuator includes an active material member composing a circuit. The member is operable to undergo a reversible transformation in fundament property when exposed to or occluded from an activation signal, and is drivenly coupled to a load, such that the transformation drives the load and produces a change in stress within the member. The actuator further includes a current source that is communicatively coupled to the member, and operable to produce a current within the circuit, so as to generate an activation signal. Finally, a piezoelectric element, also composing the circuit, is communicatively coupled to the member, and operable to vary the voltage in the circuit, as a result of the change. The member, source, and element are cooperatively configured, such that varying the voltage modifies (e.g., reduces, maintains, regulates, etc.) the current and controls the stress in the member.

In a second aspect of the invention, the actuator utilizes a piezoresistive element communicatively coupled to the member and source, and operable to vary the resistance in the circuit, as a result of an applied mechanical stress thereto. Here again, the member, source, and element are cooperatively configured, such that varying the resistance modifies the current and reduces the stress in the member.

This disclosure, including the description of plural examples of alternative force sensing devices, may be understood more readily by reference to the following detailed description of the various features of the disclosure and the examples included therein.

BRIEF DESCRIPTION OF THE SEVERAL VIEWS OF THE DRAWING

A preferred embodiment(s) of the invention is described in detail below with reference to the attached drawing figures of exemplary scale, wherein:

FIG. 1 is a schematic diagram of a prior art active material actuator including a conventional overload protection mechanism comprising a spring and lever;

FIG. 2 is a circuit diagram of an active material actuator including a piezoelectric element connected mechanically in series with an active material member, and communicatively coupled to a transistor that feeds the member, in accordance with a preferred embodiment of the invention;

FIG. 3 is a circuit diagram of an active material actuator including a piezoresistive element connected mechanically and electrically in series with an active material member, in accordance with a preferred embodiment of the invention;

FIG. 4 is a circuit diagram of an active material actuator including a piezoresistive element connected mechanically in series and electrically in parallel with an active material member, in accordance with a preferred embodiment of the invention;

BRIEF DESCRIPTION OF THE SEVERAL VIEWS OF THE DRAWING

Figure 2A:
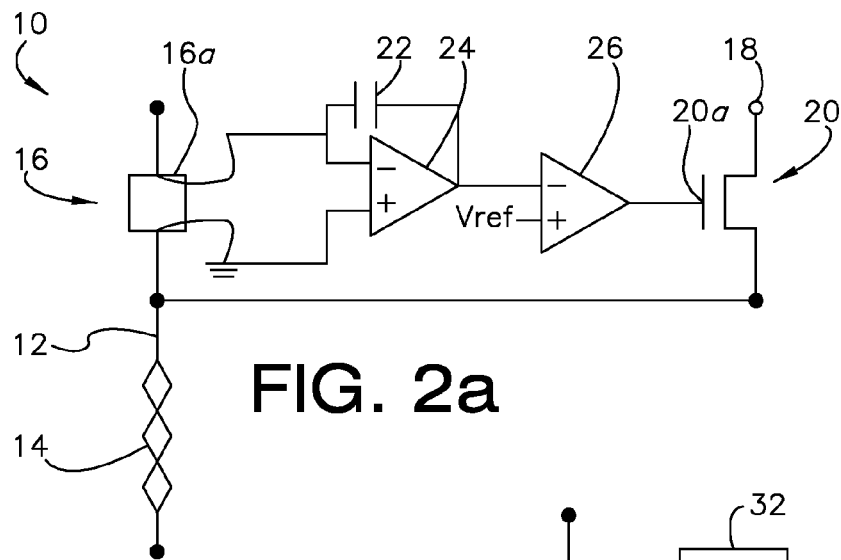
FIG. 2a is a circuit diagram of the actuator shown in FIG. 2, further including an op-amplifier and comparator intermediately connected to the element and transistor, in accordance with a preferred embodiment of the invention.

The present invention concerns an active material actuator 10 (FIGS. 2-4) adapted for use in a circuit 12, and including an active material member 14 operable to manipulate a load when exposed to an activation signal and a novel overload protection mechanism 16 communicatively coupled to the member 14. In contrast to prior art overload protection mechanisms (FIG. 1), the actuator 10 disclosed herein advantageously employs a piezoelectric or piezoresistive element (or otherwise force sensing device) 16*a,b* that functions to autonomously adjust the current and/or voltage within the circuit 12, and therefore modify the activation signal, when engaged by a predetermined stress in the member 14. As used herein, a "piezoelectric" element refers to a material, natural or synthetic, that when subjected to a stress generates an electric potential; and a "piezoresistive" element refers to materials, natural or synthetic, that when subjected to a stress generates a change in electrical resistance.

The term "active material" shall be afforded its ordinary meaning as understood by those of ordinary skill in the art, and includes any material or composite that exhibits a reversible change in a fundamental (e.g., chemical or intrinsic physical) property, when exposed to an external signal source. Suitable active materials for use with the present invention include but are not limited to shape memory alloys (SMA), ferromagnetic SMA, electroactive polymers (EAP), and other equivalent active materials that are subject to overloading, compose circuits, and utilize electric current/potential to generate a suitable activation signal. Depending on the particular active material, the activation signal can take the form of, without limitation, an electric current, an electric field (voltage), a magnetic field, a temperature change, and the like.

More particularly, shape memory alloys (SMA's) generally refer to a group of metallic materials that demonstrate the ability to return to some previously defined shape or size when subjected to an appropriate thermal stimulus. Shape memory alloys are capable of undergoing phase transitions in which their yield strength, stiffness, dimension and/or shape are altered as a function of temperature. The term "yield strength" refers to the stress at which a material exhibits a specified deviation from proportionality of stress and strain. Generally, in the low temperature, or Martensite phase, shape memory alloys can be pseudo-plastically deformed and upon exposure to some higher temperature will transform to an Austenite phase, or parent phase, returning to their shape prior to the deformation.

Shape memory alloys exist in several different temperature-dependent phases. The most commonly utilized of these phases are the so-called Martensite and Austenite phases discussed above. In the following discussion, the Martensite phase generally refers to the more deformable, lower temperature phase whereas the Austenite phase generally refers to the more rigid, higher temperature phase. When the shape memory alloy is in the Martensite phase and is heated, it begins to change into the Austenite phase. The temperature at which this phenomenon starts is often referred to as Austenite start temperature ($A_s$). The temperature at which this phenomenon is complete is called the Austenite finish temperature ($A_f$).

When the shape memory alloy is in the Austenite phase and is cooled, it begins to change into the Martensite phase, and the temperature at which this phenomenon starts is referred to as the Martensite start temperature ($M_s$). The temperature at which Austenite finishes transforming to Martensite is called the Martensite finish temperature ($M_f$). Generally, the shape memory alloys are softer and more easily deformable in their Martensitic phase and are harder, stiffer, and/or more rigid in the Austenitic phase. In view of the foregoing, a suitable activation signal for use with shape memory alloys is a thermal activation signal having a magnitude to cause transformations between the Martensite and Austenite phases.

Shape memory alloys can exhibit a one-way shape memory effect, an intrinsic two-way effect, or an extrinsic two-way shape memory effect depending on the alloy composition and processing history. Annealed shape memory alloys typically only exhibit the one-way shape memory effect. Sufficient heating subsequent to low-temperature deformation of the shape memory material will induce the Martensite to Austenite type transition, and the material will recover the original, annealed shape. Hence, one-way shape memory effects are only observed upon heating. Active materials comprising shape memory alloy compositions that exhibit one-way memory effects do not automatically reform, and will likely require an external mechanical force to reform the shape.

Intrinsic and extrinsic two-way shape memory materials are characterized by a shape transition both upon heating from the Martensite phase to the Austenite phase, as well as an additional shape transition upon cooling from the Austenite phase back to the Martensite phase. Intrinsic two-way shape memory behavior must be induced in the shape memory material through processing. Such procedures include extreme deformation of the material while in the Martensite phase, heating-cooling under constraint or load, or surface modification such as laser annealing, polishing, or shot-peening. Once the material has been trained to exhibit the two-way shape memory effect, the shape change between the low and high temperature states is generally reversible and persists through a high number of thermal cycles. In contrast, active materials that exhibit the extrinsic two-way shape memory effects are composite or multi-component materials that combine a shape memory alloy composition that exhibits a one-way effect with another element that provides a restoring force to reform the original shape.

The temperature at which the shape memory alloy remembers its high temperature form when heated can be adjusted by slight changes in the composition of the alloy and through heat treatment. In nickel-titanium shape memory alloys, for instance, it can be changed from above about 100° C. to below about −100° C. The shape recovery process occurs over a range of just a few degrees and the start or finish of the transformation can be controlled to within a degree or two depending on the desired application and alloy composition. The mechanical properties of the shape memory alloy vary greatly over the temperature range spanning their transformation.

Suitable shape memory alloy materials include, without limitation, nickel-titanium based alloys, indium-titanium based alloys, nickel-aluminum based alloys, nickel-gallium based alloys, copper based alloys (e.g., copper-zinc alloys, copper-aluminum alloys, copper-gold, and copper-tin alloys), gold-cadmium based alloys, silver-cadmium based alloys, indium-cadmium based alloys, manganese-copper based alloys, iron-platinum based alloys, iron-platinum based alloys, iron-palladium based alloys, and the like. The alloys can be binary, ternary, or any higher order so long as the alloy composition exhibits a shape memory effect, e.g., change in shape orientation, damping capacity, and the like.

It is appreciated that SMA's exhibit a modulus increase of 2.5 times and a dimensional change (recovery of pseudo-plastic deformation induced when in the Martensitic phase) of up to 8% (depending on the amount of pre-strain) when heated above their Martensite to Austenite phase transition temperature. It is appreciated that thermally induced SMA phase changes are one-way so that a biasing force return mechanism (such as a spring) would be required to return the SMA to its starting configuration once the applied field is removed. Joule heating can be used to make the entire system electronically controllable.

In a first aspect of the invention, an external force causes a deformation of a piezoelectric crystal, which results in a charge that is a function of the applied force. This relationship is used in conjunction with the active material member 14, so as to provide overload protection thereto. In FIG. 2, an exemplary actuator 10 having a piezoelectric overload protection mechanism (or "element") 16a is shown. The actuator 10 is powered by a voltage source 18. The piezoelectric element 16a is mechanically connected in series with the active material member (e.g., SMA wire) 14 through non-conductive means, and terminates at the opposite end to a mechanical ground, such that the element 16a is unpowered. The member 14 proceeds towards an electrical ground and is mechanically connected to a load (not shown). A transistor 20 is electrically connected in series to the member 14 and contributorily coupled to the piezoelectric element 16a. It is appreciated that the piezoelectric element 16a and transistor 20 can be integrated into one unit, allowing use of the invention in different packaging situations of varying sizes.

In operation, when a sufficient change in stress in member 14 is registered by the piezoelectric element 16a, the element 16a produces an electric potential that causes the transistor 20 to reduce or eliminate current to the active material member 14. For example, if a sudden spike in the stress level is experienced due to blockage or unexpected impact, the corresponding jump in voltage will trigger the transistor 20, shutting off the current supplied to the SMA. More preferably, the element 16a and member 14 are chosen such that the actuator 10 is sensitive enough to detect a gradual overloading of the member 14. Here, it is appreciated that the time required for the active material member 14 to activate must be sufficiently short with respect to the discharge time constant of the piezoelectric element 16a in order for an increase of stress to trigger the piezoelectric element 16a.

More particularly, as the member 14 squeezes/pulls the piezoelectric element 16a, an electric field/voltage is generated across its thickness. As the stress applied by the member 14 increases, the voltage generated by the piezoelectric 16a also rises. By tailoring the geometry/characteristics of the piezoelectric 16a properly, the piezoelectric element 16a preferably supplies a level of voltage sufficient to drive the gate/base 20a of the transistor 20, such that the current across the transistor 20 can be reduced or shut off only when the member 14 is stressed above a prescribed limit.

It is appreciated that the element 16a and transistor 20 can be combined into a piezotransistor that utilizes anisotropic stress effect to drive protection. Here, where the upper surface of a p-n diode is subjected to a localized stress, a significant reversible change in current is caused across the junction. For example, a silicon nonplanar type piezotransistor, having an emitter base junction may be utilized, wherein the junction is mechanically connected to a diaphragm positioned on the upper surface. When a pressure or force is applied to the diaphragm an electronic charge is produced. The piezotransistor is preferably used at constant temperature, as it is appreciated that temperature variation causes changes in their electric properties. Advantageously, however, it is also appreciated that piezotransistor can withstand a 500% overload.

More preferably, and as shown in FIGS. 2a,b, the charge across the piezoelectric element 16 can be integrated through an integrator circuit comprising a feedback capacitor 22 between the output and negative input of an operational (op)-amplifier 24 such that the output voltage is the accumulated charge/voltage change (i.e., proportional to the total force). In FIG. 2b, the integrator op-amp 24 includes a resistor 25. The output voltage is compared with a reference voltage that corresponds to the force threshold at a comparator 26. The output from the comparator 26 is used to drive the gate/base 20a of the transistor 20 such that the current across the transistor 20 can be reduced or shut off when the SMA member 14 is stressed above a prescribed limit since the comparator 26 will output a low voltage (e.g., ground). If the stress level drops sufficiently so that output voltage of the first op-amp 24 is below the reference voltage then the output of the comparator 26 will be high (e.g., 12V), so as to resume power to the member 14. Alternatively, it is appreciated that other analog circuits that adjust the voltage based on the output of the piezoelectric element could be utilized; for example, a built in IC chip amplifier can be used to convert the high impedance signal generated by the crystal to a low impedance voltage suitable for coupling to overload protection circuitry.

Figure 2C:
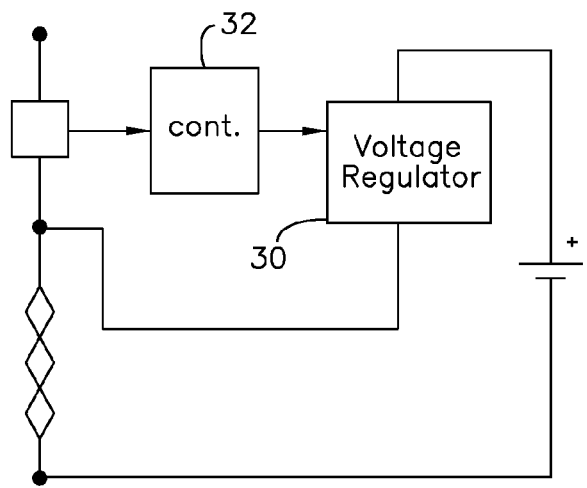
FIG. 2c is a circuit diagram of an active material actuator, including a voltage regulator communicatively coupled to an active material member, and a piezoelectric element communicatively coupled to the regulator through a controller, in accordance with a preferred embodiment of the invention.
Figure 2B:
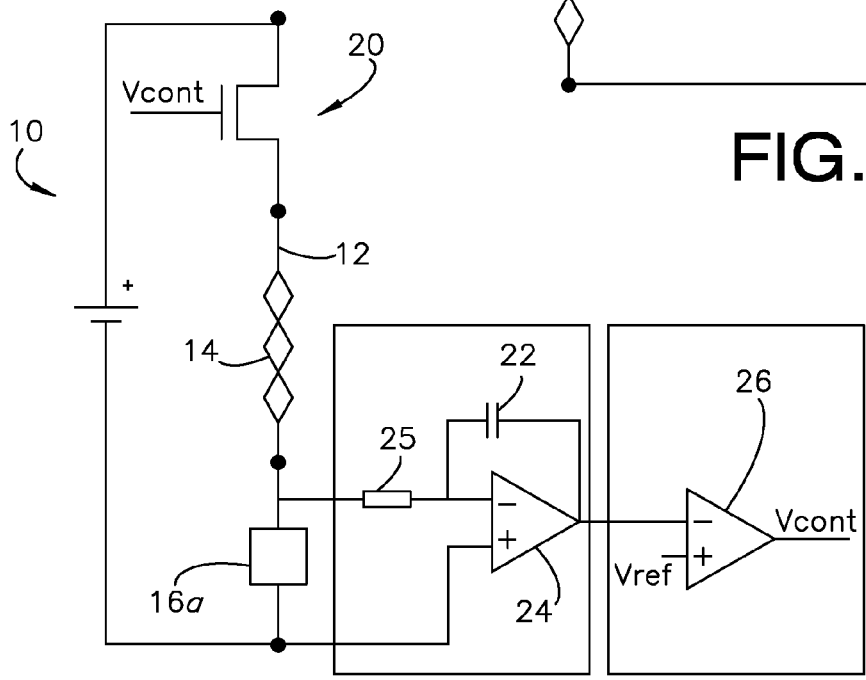
FIG. 2b is a circuit diagram of the actuator shown in FIG. 2, including an integrator op-amplifier having a resistor, and comparator intermediately connected to the element and transistor, in accordance with a preferred embodiment of the invention.
Figure 2D:
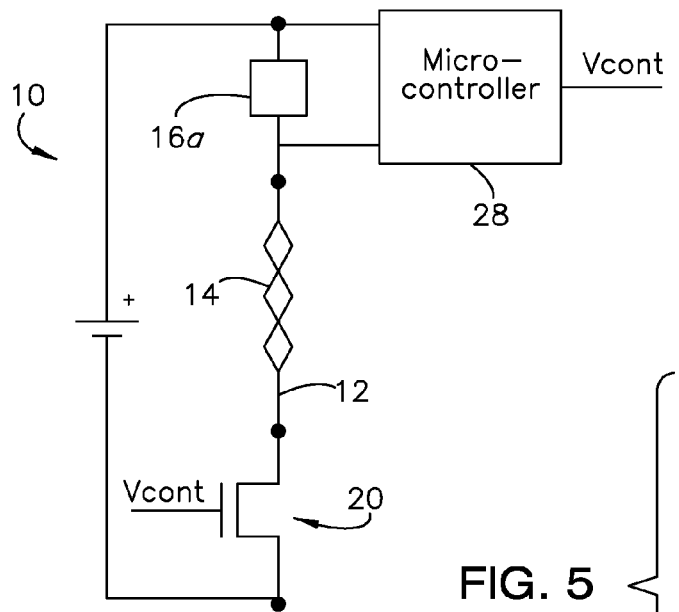
FIG. 2d is a circuit diagram of an active material actuator, including a transistor communicatively coupled to an active material member, and a micro-controller communicatively coupled to the transistor, in accordance with a preferred embodiment of the invention.

As shown in FIGS. 2c,d, the integrator/comparator may be replaced by a micro-controller 28 in a digital control circuit. More particularly, in FIG. 2c, a voltage regulator 30 is used to adjust the voltage across the SMA member 14. Given a fixed DC input voltage and an input control signal from the piezoelectric element 16a and through a controller 32, the voltage regulator 30 varies the output voltage. In FIG. 2d, a digital control circuit, including, for example, a micro-controller 28 is used to read the output of the piezoelectric element 16a and then generate the control signal based on the output, and more preferably based on the output plus environmental variables such as the input voltage, temperature, a vehicle event, and the like. The control signal is then used to control the voltage across the member 14 through a transistor 20 (FIG. 2d) or voltage regulator 30.

Thus, as previously mentioned, the triggering of the transistor 20 can be used to completely stop the current actuation cycle, or temporarily cease heating the member 14. Where stress levels drop sufficiently, the piezoelectric voltage level no longer triggers the transistor 20. This re-exposes the member 14 to a sufficient activation signal, thereby resuming actuation. In the case where the current to the member 14 is only reduced, it is appreciated that the lower current will keep the member 14 heated without progressing actuation. This allows for the overload condition to be otherwise addressed without introducing many actuation inner loops in the member 14, which potentially increases the life of the member 14.

In an alternative embodiment, the transistor 20 is selected such that the electric current generated by the change in stress is sufficient to activate the transistor 20. Here, the active transistor 20 ceases current flow from the power source 18 until another change in stress indicating a return to normal operation and desired stress levels is detected. It is appreciated that the signal can be fed into a controller for advanced control.

Finally, in another preferred embodiment, the source 18 may be connected to the piezoelectric element 16a so as to provide a base level of current thereto. This allows activation of the transistor 20 at smaller amounts of stress change, and as such, results in a more responsive actuator 10. The supplied power provides a quasi-static voltage output that eliminates decay and/or amplifies the voltage output enough to trigger the transistor 20.

Referring now to FIG. 3, an actuator 10 having a piezoresistive element 16b is shown. As in FIG. 2, the circuit 12 again includes a power source 18 and an active material member 14 operatively coupled thereto. The piezoresistive element 16b is connected in series with the member 14 both electrically and mechanically. As the stress within the member 14 rises, the resistance in the element 16*b* increases proportionally. The preferred member 14 and element 16*b* are cooperatively configured such that the resistance attained when the member 14 reaches a predetermined overloading stress level is sufficient to reduce current flow to the member 14 to a level insufficient for activation. As the stress subsides, the resistance is reduced, such that current flow increases. As such, the actuator 10, in this configuration, is operable to regulate current flow, so as to maintain an activated state, while providing overload protection.

Materials suitable for used in this embodiment include conductive elastomers, and pressure-sensitive inks. More particularly, the element 16*b* may be a conductive elastomer, such as the type fabricated of silicone rubber, polyurethane, and other compounds impregnated with conductive particles or fibers. For example, conductive rubber can be fabricated by using carbon powder as an impregnating material. The operating principles of elastomeric sensors are based either on varying the contact area when the elastomer is squeezed between two piezoelectric plates or in changing the thickness. Thus this type of FSR (force-sensitive resistor) is more useful for qualitative rather than quantitative measurements.

Alternatively, the piezoresistive material can also be made of silicon, and more particularly, a silicon-diaphragm pressure sensor consisting of a thin elastic silicon diaphragm and diffusive impurities added to the diaphragm. It is appreciated that because of the superior elastic characteristics of single-crystal silicon, virtually no creep and no hysteresis occur, even under strong static pressure, and that the gauge factor of silicon is many times stronger than that of thin metal conductors. In either scenario, the force sensor operates on the principle that the resistance of silicon implanted piezoresistors will increase when the resistors flex under an applied force.

In another alternative, the piezoresistive material is made of carbon disks. Here, the resistive method employs the fact that when the multiple contact areas between semiconducting particles (usually carbon) and the distance between the particles are changed, the total resistance is altered. The carbon-based piezoresistive element 16*b* is configured such that a very small displacement occurs when a force is applied. In a particular example, the element 16*b* may consist of 2 to 60 thin carbon disks (not shown) mounted between a fixed and a movable electrode (also not shown). When a force is applied to the movable electrode, the carbon disks move relative to each other by 5 to 250 mm per interface, the transfer function of their resistance against the applied force is approximately hyperbolic. More preferably, in this configuration, in order to reduce hysteresis and drift, rings are used instead of disks. The rings are mounted on an insulated rigid core and pre-stressed, so as to completely eliminate transverse sensitivity error. The resonant frequency of the core is preferably high (e.g., 10 kHz). Finally, it is appreciated that the effective measuring range of such an element 16*b* is from 0.1 kg to 10 kg.

A third embodiment is shown in FIG. 4, wherein the piezoresistive element 16*b* is mechanically connected in series to the member 14, and the element 16*b* and member 14 are electrically connected in parallel to the source 18, so as to compose the circuit 12. In this configuration, increased resistance within the element 16*b* causes an increase in current to the member 14. As such, the element 16*b* may be used to reduce the required energy input to maintain activation by increasing the current flowing through the member 14 branch once activated, and a reduced current can be supplied by the power source 18 in the normally deactivated state.

As previously mentioned, the piezoelectric or piezoresistive element 16*a,b* may be supplanted by another force sensing/regulating device that communicates with the SMA member 14, so as to control current flow thereto. For example, it is appreciated by those of ordinary skill in the art that force sensing resistors, induction-based transducers, magneto-elastic force sensors, force/pressure sensing photointerruptors, optical fiber sensors, linear/clock spring and potentiometer combinations, force sensing diodes and the like, may be used in place of the piezo-element 16. These alternative devices and circuits are in series with the actuator 14 as generally shown at FIGS. 2 and 3 with the understanding that necessary modification including the addition of intermediate components may be required to enable intercommunication between the device 16 and SMA member 14.

Figure 5:
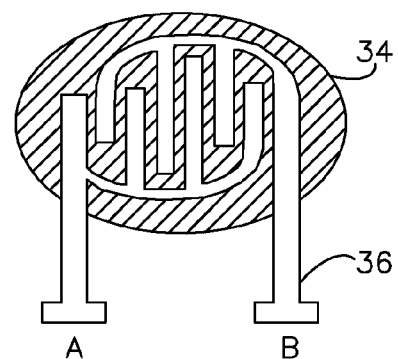
FIG. 5 is an elevation of a force-sensing resistor suitable for use with the present invention, in accordance with a preferred embodiment of the invention.

More particularly, force sensing resistors (FSRs) utilize the fact that certain polymer thick-film devices exhibit decreasing resistance with the increase of an applied force. FSRs generally comprise two parts; the first is a resistive material applied to a film 34; and the second is a set of contacts 36 (A,B) applied to another film (overlapping with 30 and not shown in FIG. 5). The resistive material completes the electrical circuit between the contacts 36 on the other film. When a force is applied to this sensor, a better connection is made between the contacts 36; hence, the conductivity is increased. Over a wide range of forces, the conductivity is approximately a linear function of force. It is appreciated that FSRs exhibit little hysteresis and are less costly than other sensing devices. Moreover, compared to piezo-film, FSRs are generally less sensitive to vibration and heat.

Figure 6:
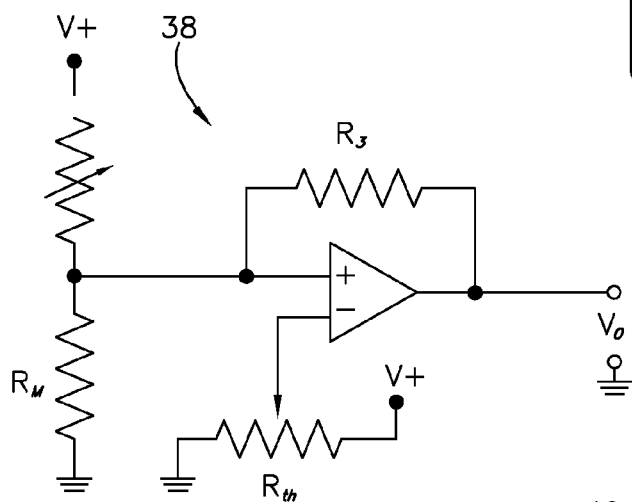
FIG. 6 is a schematic diagram of a comparator circuit suitable for use with the present invention, in accordance with a preferred embodiment of the invention.

As shown in FIG. 6, a comparator circuit 38 may replace the piezoelectric element 16*a* to rapidly toggle between "On" and "Off" states, resulting from the resistance change of a piezo-resistive material including force sensing resistor. The circuit 38 takes an analog sensor voltage and compares it to a threshold voltage. If the voltage of the sensor is greater than the threshold, the output of the circuit 38 is maximum (e.g., 5V). If the output is less than the threshold, the output of the circuit 38 is minimum (e.g., 0V). The threshold voltage is set by adjusting the potentiometer labeled $R_{th}$ in FIG. 6. The output of the sensor may also be reduced by using the resistor divider network as shown. It is appreciated that the circuit 38 has a positive feedback resistor, $R_3$, which causes the output of the comparator op-amp 26 to swing quickly and completely from maximum to minimum output With respect to induction-based transducers, the element 16 advantages the fact that a change in mechanical stress of a ferromagnetic material, such as nickel-iron alloys, alters the permeability of the material. This change in magnetic flux is converted into induced voltages in pickup coils as the movement takes place, in a phenomenon known as the Villari effect or magnetostriction. Transducers 16 utilizing this effect consist of a coil (not shown) wound around a core (also not shown) of magnetostrictive material. The force to be measured is applied on the core, such that stressing the core causes a change in its permeability and inductance. The change is monitored and used for determining the force. It is appreciated that the applicable range for these transducers is a function of the cross-sectional area of the core, and that accuracy is determined by a calibration process. The permeability of a magnetostrictive material increases when it is subjected to pure torsion, regardless of direction. Finally, it is appreciated that a flat frequency response is obtained over a wide range from 150 Hz to 15,000 Hz.

In another example, magnetoelastic transducers 16 operate based on the Joule effect, wherein a ferromagnetic material is dimensionally altered when subjected to a magnetic field. Initially, a current pulse is applied to a conductor (not shown) within a waveguide (also not shown) to set up a magnetic field circumference-wise over the entire length of the waveguide. Another magnetic field is generated by a permanent magnet only where the magnet is located. This field has a longitudinal component. Next, these two fields join vectorally to form a helical field near the magnet, which, in turn, causes the waveguide to experience a minute torsional strain or twist (known as the Wiedemann effect) only at the location of the magnet. Magnetoelastic force transducers 16 have a high frequency response (on the order of 20 kHz). Materials exhibiting magnetoelasticity, include, but are not limited to Monel metal, Permalloy, Cekas, Alfer, and a number of nickel-iron alloys.

Figure 7:
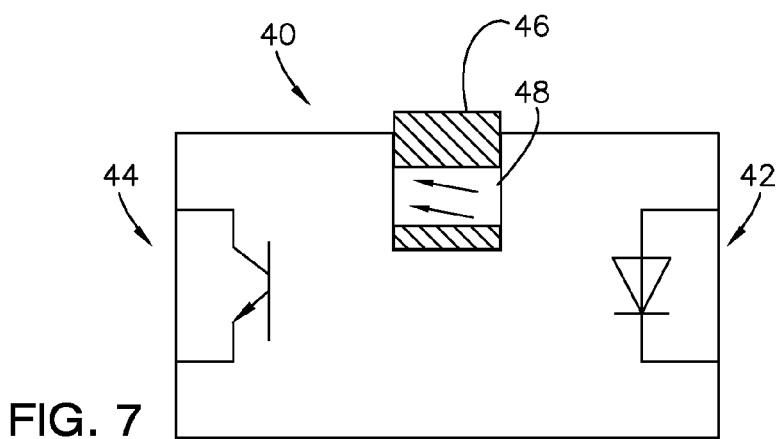
FIG. 7 is a schematic diagram of a photointerruptor suitable for use with the present invention, in accordance with a preferred embodiment of the invention.

A force/pressure sensing photointerruptor 40 may exemplarily comprise a phototransistor output and a transmissive photointerruptor further comprising an opposing emitter and detector in a molding that provides non-contact sensing (FIG. 7). Where a tube or block 46 with an IR passing channel 48 is placed between the opposing emitter 42 and detector 44 and the cross-sectional area of the channel 48 is made to change with the amount of pressure/force applied, then the amount of light transmitted will change. This change can be used as input to the overload protection circuit 12. For example, the heat to the SMA member 14 may be turned on when the passing through light is above a threshold and turned off when below.

Optical fibers can also be used as low-complexity sensors to measure pressure/force by modifying a fiber so that the quantity to be measured modulates the intensity, phase, polarization, wavelength or transit time of light in the fiber. In the present invention, overload protection may be triggered by the output from the optical fiber sensor. For example, the overload protection may be configured to terminate heating of SMA when the optical fiber sensor senses at least a minimum pressure/force.

A linear/clock spring and potentiometer combination may be used for force sensing. Here, it is appreciated that the member 14 may be drivenly coupled to the spring and the heat contribution to the SMA 14 turned on when the potentiometer wiper resistance is above a threshold and turned off when it is below.

Finally, force switchable diodes (FSDs) may be used to offer a bi-stable solid state switching device that toggles the actuator 10 between "On" and "Off" states. The diodes are provided by copper/cuprous oxide rectifying or "blocking" junction devices, exemplified in elemental form by a copper substrate, a contacting thin cuprous oxide layer and the interface between them. Such devices are arranged to avalanche from a blocking state to an essentially conducting state on the application of force when under a related voltage, and avalanche back to a blocking state on the removal of at least a portion of that force. The transition between the states is sharp, predictable and free of arcing effects. A single copper/cuprous oxide junction provides unidirectional switching, and an assembly comprising a set of copper/cuprous oxide/copper junctions provides bi-directional switching or polarity insensitivity. De-switching does not require a reduction of applied voltage, nor does switching require an increase in applied voltage. FSDs, however, provide an inverse relationship between switching force and voltage, and a positive relationship between switching force and thickness of the cuprous oxide layer.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Also, as used herein, the terms "first", "second", and the like do not denote any order or importance, but rather are used to distinguish one element from another, and the terms "the", "a", and "an" do not denote a limitation of quantity, but rather denote the presence of at least one of the referenced item. All ranges directed to the same quantity of a given component or measurement is inclusive of the endpoints and independently combinable.

What is claimed is:

1. An active material actuator adapted for use in a circuit and preventing overloading, said actuator comprising:
    an active material member composing the circuit, operable to undergo a reversible transformation in fundament property when exposed to or occluded from an activation signal, and drivenly coupled to a load, such that the transformation produces a change in stress within the member;
    a current source composing the circuit, communicatively coupled to the member, and operable to produce a current within the circuit, so as to generate the activation signal; and
    a piezoelectric element communicatively coupled to the member, and operable to vary the voltage in the circuit, as a result of the change,
    said member, source, and element being cooperatively configured, such that varying the voltage modifies the current and reduces the stress in the member.

2. The actuator as claimed in claim 1, wherein the member presents an actuation period, the element presents a discharge time constant, and the period and constant are cooperatively configured such that the element is operable to detect a gradual overloading event.

3. The actuator as claimed in claim 1, wherein the member, source, and element are cooperatively configured, such that varying the voltage terminates the current when the stress exceeds a predetermined threshold.

4. The actuator as claimed in claim 1, wherein the element presents a piezo-voltage subject to decay, the element is communicatively coupled to the source, so as to provide a quasi-static voltage output to the element, and the output is operable to eliminate the decay and/or amplify the piezo-voltage.

5. The actuator as claimed in claim 1, further comprising:
    a transistor further composing the circuit, and communicatively coupled to the element, wherein the element is operable to vary the voltage across the transistor, and the transistor modifies the current as a result of the variation in voltage.

6. An actuator as claimed in claim 5, wherein the piezoelectric element and the transistor are integral.

7. The actuator as claimed in claim 5, wherein an analog or digital control circuit is communicatively coupled and operable to deliver a control signal to the transistor.

8. The actuator as claimed in claim 7, wherein a comparator is intermediately disposed between the element and transistor, and configured to deliver an output, toggled between high and low voltage, to the transistor.

9. The actuator as claimed in claim 8, wherein an operational amplifier is communicatively coupled to the comparator, and a feedback capacitor is coupled to the output and negative input of the amplifier, such that the output of the amplifier is an accumulated voltage change.

10. The actuator as claimed in claim 5, further comprising a micro-controller intermediately coupled to the element and transistor.

11. The actuator as claimed in claim 1, further comprising:
a voltage regulator further composing the circuit, and communicatively coupled to the element, wherein the element is operable to vary the input to the regulator, and the regulator is operable to modify the voltage across the member.

12. The actuator as claimed in claim 11, wherein an analog or digital control circuit is communicatively coupled and operable to deliver a control signal to the regulator.

13. The actuator as claimed in claim 12, further comprising:
a controller intermediately coupled to the element and regulator.

14. An active material actuator adapted for use in a circuit and preventing overloading, said actuator comprising:
an active material member composing the circuit, operable to undergo a reversible transformation in fundament property when exposed to or occluded from an activation signal, and drivenly coupled to a load, such that the transformation produces a stress in the member;
a current source composing the circuit, communicatively coupled to the member, and operable to produce a current within the circuit, so as to generate the activation signal; and
A piezoresistive element communicatively coupled to the member and source, and operable to vary the resistance in the circuit, as a result of the stress,
said member, source, and element being cooperatively configured, such that varying the resistance modifies the current and reduces the stress in the member.

15. The actuator as claimed in claim 14, wherein the element is electrically and mechanically connected in series to the member and source.

16. The actuator as claimed in claim 15, wherein the element and member are cooperatively configured such that the resistance attains a level sufficient to reduce the current to a non-activating level, when the member achieves a predetermined stress.

17. The actuator as claimed in claim 14, wherein the element is mechanically connected in series, and electrically connected in parallel to the member.

18. An active material actuator adapted for use in a circuit and preventing overloading, said actuator comprising:
an active material member composing the circuit, operable to undergo a reversible transformation in fundament property when exposed to or occluded from an activation signal, and drivenly coupled to a load, such that the transformation produces a stress in the member;
a current source composing the circuit, communicatively coupled to the member, and operable to produce a current within the circuit, so as to generate the activation signal; and
A force sensing device communicatively coupled to the member and source, and operable to vary the current in the circuit,
said member, source, and element being cooperatively configured to selectively modify the current when the stress exceeds a predetermined threshold.

19. The actuator as claimed in claim 18, wherein the device is selected from the group consisting essentially of piezoelectric elements, piezoresistive elements, force sensing resistors, induction-based transducers, magnetoelastic force sensors, force/pressure sensing photointerruptors, optical fiber sensors, linear/clock spring and potentiometer combinations, and force sensing diodes.

* * * * *